United States Patent
Brody et al.

(10) Patent No.: US 7,361,585 B2
(45) Date of Patent: Apr. 22, 2008

(54) SYSTEM FOR AND METHOD OF PLANARIZING THE CONTACT REGION OF A VIA BY USE OF A CONTINUOUS INLINE VACUUM DEPOSITION

(75) Inventors: Thomas P. Brody, Pittsburgh, PA (US); Joseph A. Marcanio, Latrobe, PA (US)

(73) Assignee: Advantech Global, Ltd, Tortola (VG)

( * ) Notice: Subject to any disclaimer, the term of this patent is extended or adjusted under 35 U.S.C. 154(b) by 154 days.

(21) Appl. No.: 11/044,140

(22) Filed: Jan. 27, 2005

(65) Prior Publication Data
US 2006/0141763 A1 Jun. 29, 2006

Related U.S. Application Data

(63) Continuation-in-part of application No. 11/026,365, filed on Dec. 30, 2004, and a continuation-in-part of application No. 11/020,907, filed on Dec. 23, 2004, now Pat. No. 7,132,361.

(51) Int. Cl.
*H01L 21/4763* (2006.01)
*H01L 21/36* (2006.01)
*H01L 21/20* (2006.01)
*H01L 21/336* (2006.01)

(52) U.S. Cl. .............. 438/622; 438/637; 438/481; 438/274

(58) Field of Classification Search .......... 438/622, 438/211, 637, 481, 274
See application file for complete search history.

(56) References Cited

U.S. PATENT DOCUMENTS

| | | | |
|---|---|---|---|
| 4,853,345 A | 8/1989 | Himelick | |
| 6,534,374 B2 * | 3/2003 | Johnson et al. | 438/381 |
| 6,730,573 B1 * | 5/2004 | Ng et al. | 438/381 |
| 2001/0053586 A1 | 12/2001 | Lee et al. | |
| 2003/0193285 A1 | 10/2003 | Kim | |
| 2003/0218254 A1 | 11/2003 | Kurimoto et al. | |
| 2004/0003775 A1 | 1/2004 | Kim | |
| 2004/0137719 A1 | 7/2004 | Jin | |
| 2006/0148241 A1 * | 7/2006 | Brody et al. | 438/637 |
| 2006/0246733 A1 * | 11/2006 | Ahn et al. | 438/717 |

* cited by examiner

*Primary Examiner*—Chuong A. Luu
(74) *Attorney, Agent, or Firm*—The Webb Law Firm

(57) ABSTRACT

A multi-layer electronic device can be formed to include an insulative substrate (212), a first vapor deposited conductor layer (312) on the insulative substrate (212), a first vapor deposited insulator layer (314) on the first conductor layer (312), the first insulator layer (314) having at least one via hole (316) therein, and a vapor deposited conductive filler (320) in the via hole (316) of the first insulator layer (314). Desirably, the conductive filler (320) is deposited in the via hole (316) of the first insulator layer (314) such that the surface of the conductive filler (320) opposite the first conductor layer (312) is substantially planar with the surface of the first insulator layer (314) opposite the first conductor layer (312).

13 Claims, 6 Drawing Sheets

SYSTEM FOR AND METHOD OF PLANARIZING THE CONTACT REGION OF A VIA BY USE OF A CONTINUOUS INLINE VACUUM DEPOSITION

CROSS REFERENCE TO RELATED APPLICATIONS

The present application is a continuation-in-part of U.S. patent application Ser. No. 11/026,365, entitled "System For And Method Of Forming Via Holes By The Use Of Selective Plasma Etching In A Continuous Inline Shadow Mask Deposition Process", filed on Dec. 30, 2004, which is incorporated herein by reference, and is also a continuation-in-part of U.S. patent application Ser. No. 11/020,907, entitled "System For And Method Of Forming Via Holes By Multiple Deposition Events In A Continuous Inline Shadow Mask Deposition Process", filed on Dec. 23, 2004, which is also incorporated herein by reference.

BACKGROUND OF THE INVENTION

1. Field of the Invention

The present invention relates to a vacuum deposition process for forming electronic elements on a substrate and, more particularly, to a method of planarizing the contact region of a via in a continuous inline vacuum deposition process.

2. Description of Related Art

In a multi-layer electronic device, such as a semiconductor device, a via is needed to provide a conductive path through a non-conductive layer (insulator or dielectric layer) in order to connect two or more conducting layers. A via is a structure formed by filling or lining a via hole (or through-hole) with conductive material which is used to electrically connect two or more conducting layers in a substrate.

The creation of vias in a typical microcircuit fabrication process is accomplished by applying a pattern or stencil of etch-resistant material over the layer through which the via is to be formed and subsequently applying an etching medium to the wafer to remove areas unprotected by the etch-resistant material. The etch-resistant material, known as photoresist, is patterned by a process called photolithography, which is a subtractive wet chemical process. Because photolithography is a subtractive process, it lends well to the formation of via holes in the manufacture of multi-layer electrical devices. The multi-layer electrical device fabrication process includes numerous deposition and etching steps in order to define appropriate patterns of conductors, insulators and vias. Exemplary photolithography processing steps that produce vias in a multi-layer electrical device include: applying a photoresist on an insulator layer; exposing the photoresist to a suitable wavelength of light to define the via locations therein; developing the photoresist whereupon photoresist is left everywhere except at the via locations; baking the photoresist; etching the insulator layer by way of the via holes in the photoresist, whereby the etchant material attacks the insulator layer but not the photoresist or the conductor below; and stripping off the remaining photoresist, thereby leaving the insulator layer with via holes therethrough on top of the conductive layer. As can be seen, the multi-layer electrical device fabrication process includes numerous deposition and etching steps in order to define vias.

Because of the number of steps required to form a multi-layer electronic device utilizing the photolithography manufacturing process, foundries of adequate capacity for volume production are expensive. Furthermore, because of the nature of the fabrication process, the production equipment must be utilized in a class one or class ten clean room. In addition, because of the amount of equipment needed and the size of each piece of equipment, the clean room must be relatively large.

Alternatively, a vapor deposition shadow mask process is well known and has been used in microelectronics manufacturing. The vapor deposition shadow mask process is a significantly less costly and less complex manufacturing process than the photolithography manufacturing process. However, in contrast to the photolithography manufacturing process, the vapor deposition shadow mask process is an additive process that is performed in a vacuum environment.

A problem associated with forming a via by the vapor deposition shadow mask process is that, in order to deposit a conductor layer atop an insulator layer and through a via hole whereby the conductor layer makes contact with another conductor layer, there is a limit to the ratio of via hole depth to conductor layer thickness for ensuring that no discontinuity of conductor material occurs as it is deposited along the walls of the via hole.

For example, as shown in FIG. 1A, a conventional via structure 100 includes a substrate 110 having an overlaying first conductor layer 112, an insulator layer 114 that includes a via hole 116 overlaying first conductor layer 112, and a second conductor layer 118 overlaying insulator layer 114 and forming by way of via hole 116 in insulator layer 114 a connection with first conductor layer 112.

Substrate 110 is formed of any standard substrate material that is suited for multi-layer electronic devices. Non-limiting examples of such materials include anodized aluminum, flexible steel foil, glass and plastic. First conductor layer 112 and second conductor layer 118 are formed of typical metals used to form interconnections in semiconductor fabrication, such as, without limitation, aluminum, gold, copper, nickel, titanium, a metal alloy or a metal compound. Insulator layer 114 is a non-conductive layer that is formed of any common circuit insulator material, such as, without limitation, aluminum oxide ($Al_2O_3$) or tantalum pentoxide ($Ta_2O_5$).

With reference to FIG. 1B and with continuing reference to FIG. 1A, a cross-sectional view of via structure 100 shows second conductor layer 118 deposited atop insulator layer 114 such that conductor layer 118 follows the contour of via hole 116 thereby making direct contact with the surface of first conductor layer 112 by way of via hole 116. Via hole 116 has a height $h_{VIA}$ that equals the thickness of insulator layer 114 and second conductor layer 118 has a thickness $t_{COND}$. In the via structure 100 shown in FIG. 1B, $t_{COND}$ equals or exceeds $h_{VIA}$ whereupon second conductor layer 118 follows the contour of insulator layer 114 into and out of via hole 116 and atop first conductor layer 112 without any discontinuity in its structure.

With reference to FIG. 1C and with continuing reference to FIGS. 1A and 1B, a cross-sectional view of via structure 100 includes first conductor layer 112, insulator layer 114, via hole 116 and second conductor layer 118. However, in the via structure 100 shown in FIG. 1C, $t_{COND}$ is less than $h_{VIA}$ whereupon second conductor layer 118 does not follow the contour of insulator layer 114 into and out of via hole 116 and atop first conductor layer 112 without any discontinuity in its structure. The larger $h_{VIA}$ of via hole 116 compared to a smaller $t_{COND}$ creates a risk of a discontinuity 120 occurring in second conductor layer 118. It is widely accepted by those skilled in the art that this risk of discontinuity is present anytime that the value of $h_{VIA}$ exceeds the value of $t_{COND}$.

A continuous inline vapor deposition shadow mask process also presents a technical challenge in making via holes without disrupting the process. For example, it is inefficient and impractical to insert one or more photolithography steps into the inline vapor deposition shadow mask process.

Therefore, what is needed, and not disclosed in the prior art, is a method and apparatus for use in an automated vapor deposition shadow mask vacuum deposition process that facilitates the formation of continuity between two conductors through a via hole where the value of $h_{VIA}$ exceeds the value of $t_{COND}$.

SUMMARY OF THE INVENTION

The invention is a method of forming a multi-layer electronic device. The method includes vapor depositing a first conductor layer on an insulative substrate by way of a first shadow mask and vapor depositing a first insulator layer on the first conductor layer by way of a second shadow mask. The first insulator layer can have at least one via hole therein. A first conductive filler can be vapor deposited in the via hole of the first insulator layer by way of a third shadow mask and a second conductor layer can be vapor deposited on the first insulator layer by way of a fourth shadow mask.

The second conductor layer can either be deposited on the first conductive filler in the via hole of the first insulator layer or can have at least one via hole therein in alignment with the via hole in the first insulator layer.

The method can further include vapor depositing a second conductive filler in the via hole of the second conductor layer by way of a fifth shadow mask and vapor depositing a second insulator layer on the second conductor layer by way of a sixth shadow mask. The second insulator layer can have at least one via hole therein in alignment with the via hole of the second conductor layer. A third conductive filler can be vapor deposited in the via hole of the second insulator layer by way of a seventh shadow mask and a third conductor layer can be vapor deposited on the second insulator layer and the third conductive filler in the via hole of the second conductor layer by way of an eighth shadow mask.

Each via hole can be formed by one of plasma etching and selective depositions of the material in which the via hole resides such that the via hole is formed only by said selective depositions.

The first conductive filler can be deposited in the via hole of the first insulator layer such that the surface of the first conductive filler opposite the first insulator layer is substantially planar with the surface of the first insulator layer opposite the first conductor layer.

Each conductive filler can be deposited such that the surface thereof opposite the layer underlying said conductive filler is substantially planar with the surface of the layer in which the via hole receiving said conductive filler resides.

The invention is also a method of forming a multi-layer electronic device. The method includes vapor depositing a first conductor layer on an insulative substrate by way of a first shadow mask and vapor depositing a first insulator layer on the first conductor layer by way of a second shadow mask. The first insulator layer has at least one via hole therein. A conductive filler can be vapor deposited in the via hole of the first insulator layer by way of a third shadow mask.

The conductive filler can be deposited in the via hole of the first insulator layer such that the surface of the conductive filler opposite the first conductor layer is substantially planar with the surface of the first insulator layer opposite the first conductor layer.

The method can further include vapor depositing a second conductor layer on the first insulator layer by way of a fourth shadow mask. The second conductor layer can either be deposited on the conductive filler in the via hole of the first insulator layer or can have at least one via hole therein in alignment with the via hole in the first insulator layer.

The conductive filler can be simultaneously vapor deposited in the via holes of the first insulator layer and the second conductor layer.

The method can further include vapor depositing a second insulator layer on the second conductor layer by way of a fifth shadow mask. The second insulator layer can have at least one via hole therein in alignment with the via hole of the second conductor layer. The conductive filler can be simultaneously vapor deposited in the via holes of the first insulator layer, the second conductor layer and the second insulator layer.

A third conductor layer can be vapor deposited on the second insulator layer and on the conductive filler in the via hole of the second insulator layer.

Lastly, the invention is a multi-layer electronic device comprising an insulative substrate; a first vapor deposited conductor layer on the insulative substrate; a first vapor deposited insulator layer on the first conductor layer, the first insulator layer having at least one via hole therein; and a vapor deposited conductive filler in the via hole of the first insulator layer.

The conductive filler can be deposited in the via hole of the first insulator layer such that the surface of the conductive filler opposite the first conductor layer is substantially planar with the surface of the first insulator layer opposite the first conductor layer.

The multi-layer electronic device can further include a vapor deposited second conductor layer on the first insulator layer. The second conductor layer either is deposited on the conductive filler in the via hole of the first insulator layer or has at least one via hole therein in alignment with the via hole in the first insulator layer.

The multi-layer electronic device can further include a vapor deposited second insulator layer on the second conductor layer. The second insulator layer can have at least one via hole therein in alignment with the via hole of the second conductor layer. The conductive filler can be deposited into the via holes of the first insulator layer, the second conductor layer and the second insulator layer in one of a single deposition step and plural deposition steps.

The multi-layer electronic device can further include a vapor deposited third conductor layer on the second insulator layer and on the conductive filler in the via hole of the second insulator layer.

Via holes in adjacent layers are considered to be in alignment when at least part of one of the aligned via holes is visible by way of the other of the aligned via holes.

DETAILED DESCRIPTION OF THE INVENTION

Figure 1A:
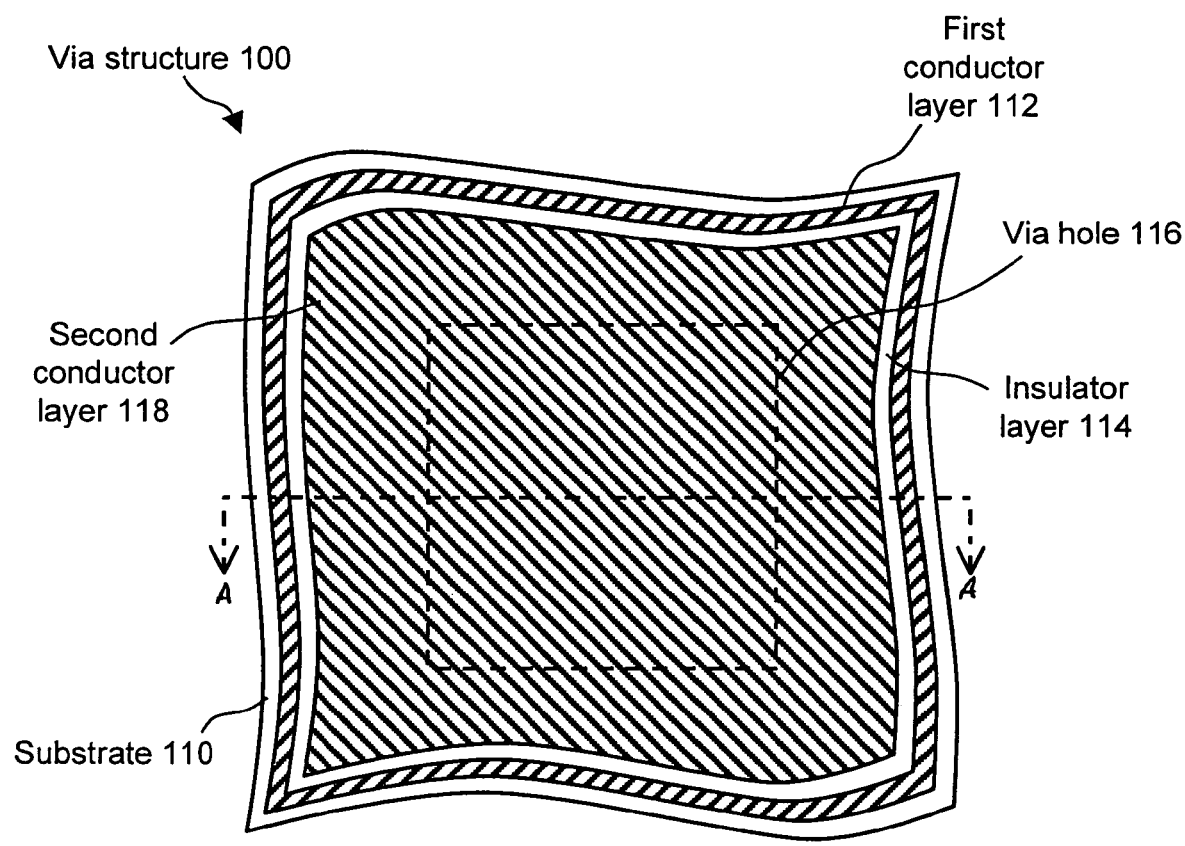
FIG. 1A is a plan view of a via structure formed by a standard process.
Figure 1B:
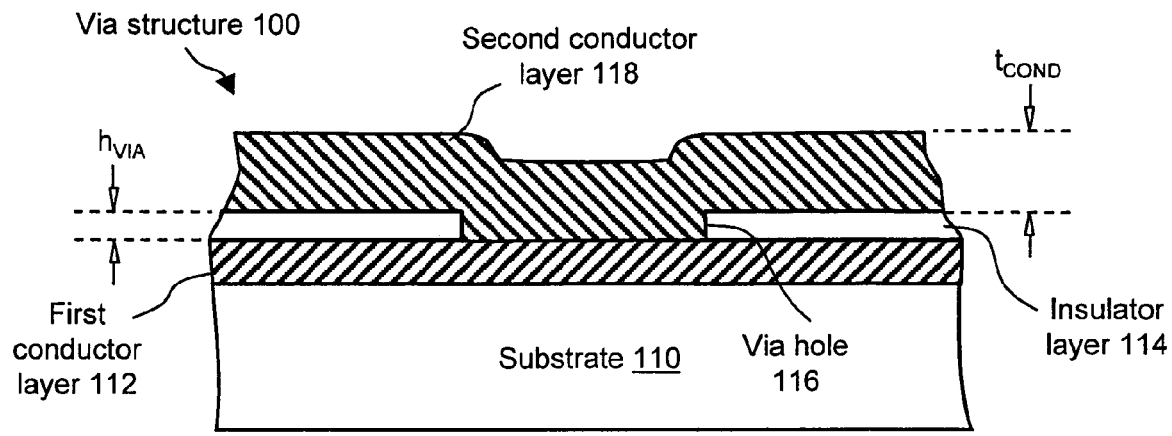
FIG. 1B is a cross-section of a first embodiment via structure formed in accordance with a prior art method taken along line A-A in FIG. 1A.
Figure 1C:
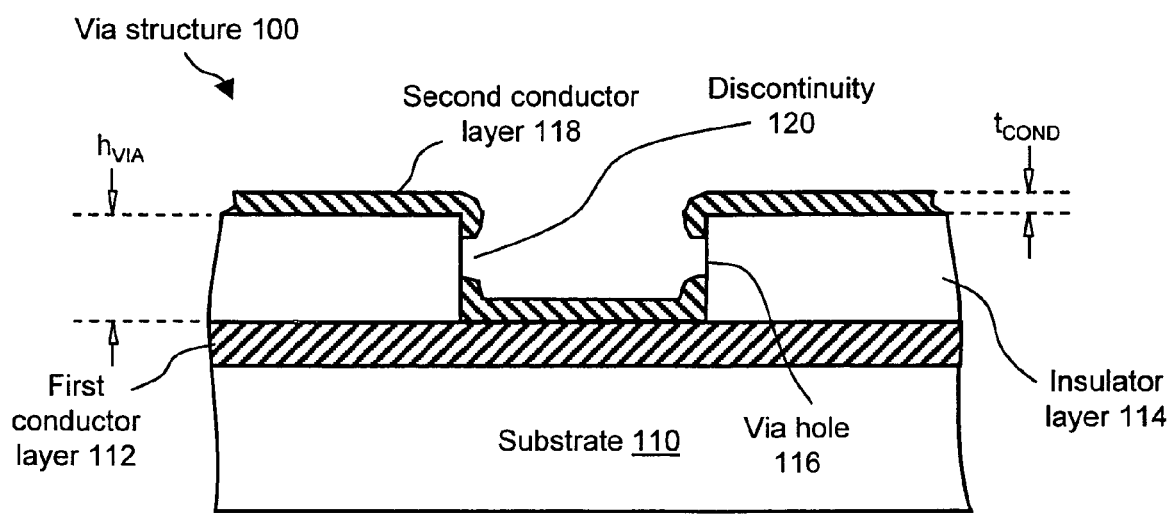
FIG. 1C is a cross section of a second embodiment via structure formed in accordance with a prior art method taken along line A-A in FIG. 1A.
Figure 2A:
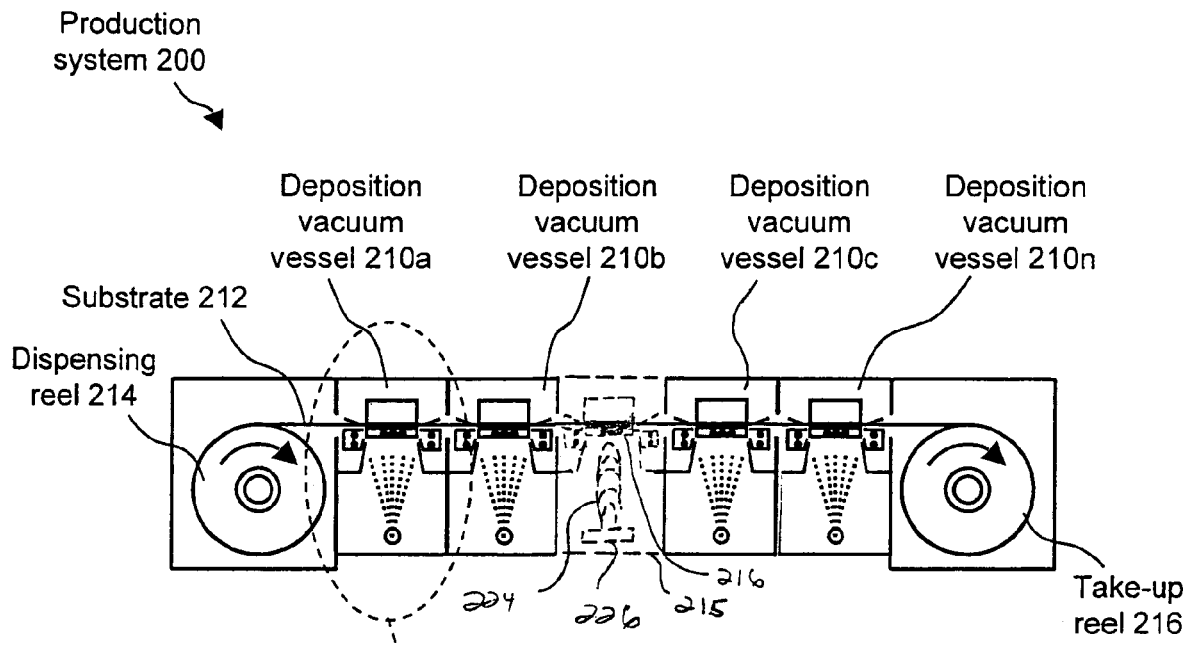
FIG. 2A is a diagrammatic illustration of a production system for forming via holes in a multi-layer electronic device by way of multiple shadow masks.
Figure 2B:
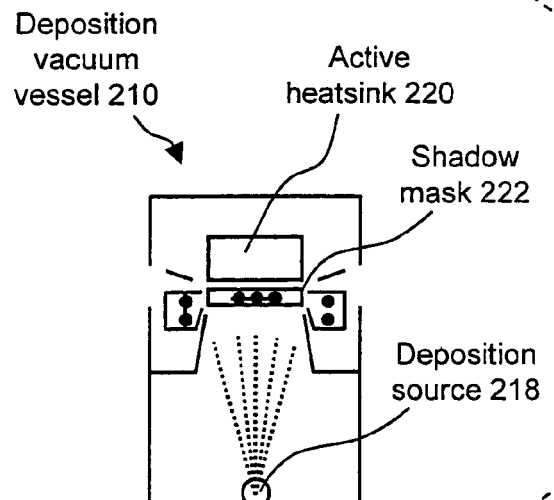
FIG. 2B is an enlarged view of a single deposition vacuum vessel of the production system of FIG. 2A.

With reference to FIGS. 2A and 2B, a vapor deposition shadow mask production system 200 includes a plurality of deposition vacuum vessels 210 (e.g., deposition vacuum vessels 210a through 210n). The number and arrangement of deposition vacuum vessels 210 is dependent on the number of deposition events and etching events required for any given product formed therewith.

In use of production system 200, a substrate 212 translates through the serially arranged deposition vacuum vessels 210 by use of, without limitation, a reel-to-reel mechanism that includes a dispensing reel 214 and a take-up reel 216.

Each deposition vacuum vessel 210 includes a deposition source 218, an active heatsink 220 and a shadow mask 222. For example, deposition vacuum vessel 210a includes a deposition source 218a, an active heatsink 220a, and a shadow mask 222a; deposition vacuum vessel 210b includes a deposition source 218b, an active heatsink 220b and a shadow mask 222b; deposition vacuum vessel 210c includes a deposition source 218c, an active heatsink 220c and a shadow mask 222c; and so forth, for any number of deposition vacuum vessels 210.

Deposition vacuum vessels 210 are arranged and connected in series. Each deposition source 218 is charged with a desired material to be deposited onto substrate 212 through its associated shadow mask 222 which is held in intimate contact with substrate 212 in the corresponding deposition vacuum vessel 210.

Each active heatsink 220 provides a flat reference surface that contacts the non-deposition side of substrate 212 during a deposition event and serves as a heat removal mechanism for substrate 212 as it translates through production system 200.

Each shadow mask 222 includes a pattern of apertures (not shown), e.g., slots and holes. The pattern of apertures formed in each shadow mask 222 corresponds to a desired pattern of material to be deposited on substrate 212 from a corresponding deposition source 218 in a corresponding deposition vacuum vessel 210 as substrate 212 advances through production system 200.

Each shadow mask 222 is formed of, for example, nickel, chromium, steel, copper, Kovar® or Invar® and has a thickness of, for example, 150-200 microns. Kovar® and Invar® can be obtained from, for example, ESPICorp Inc. of Ashland, Oreg. In the United States, Kovar® is a registered trademark, Registration No. 337,962, currently owned by CRS Holdings, Inc. of Wilmington, Del., and Invar® is a registered trademark, Registration No. 63,970, currently owned by Imphy S.A. Corporation of France.

Those skilled in the art will appreciate that production system 200 may include additional stages (not shown), such as an anneal stage, a test stage, one or more cleaning stages, a cut and mount stage, and the like, as is well known. In addition, the number, purpose, and arrangement of deposition vacuum vessels 210 can be modified, as needed, for depositing one or more materials required for a particular application. An exemplary production system 200 disclosed in U.S. Patent Application Publication No. 2003/0228715, entitled, "Active Matrix Backplane For Controlling Controlled Elements And Method Of Manufacture Thereof", which is incorporated herein by reference.

Deposition vacuum vessels 210 can be utilized for depositing materials on substrate 212 in order to form one or more electronic elements on substrate 212. Each electronic element may be, for example, a thin film transistor (TFT), a diode, a memory element or a capacitor. A multi-layer circuit can be formed solely by the successive deposition events in deposition vacuum vessels 210.

Each deposition vacuum vessel 210 is connected to a source of vacuum (not shown) used for establishing a suitable vacuum therein in order to enable a charge of the desired material that is disposed in the corresponding deposition source 218 to be deposited on substrate 212 in a manner known in the art, e.g., sputtering or vapor phase deposition, through apertures in the corresponding shadow mask 222.

In the following description, substrate 212 is described as being a continuous flexible sheet which is dispensed from dispensing reel 214, which is positioned in a preload vacuum vessel, into the first deposition vacuum vessel 210. However, this is not to be construed as limiting the invention since production system 200 can be configured to continuously process a plurality of standalone or individual substrates 212 which may be flexible or inflexible. Each deposition vacuum vessel 210 includes supports or guides that avoid the sagging of substrate 212 as it is advanced therethrough.

In operation of production system 200, the material disposed in each deposition source 218 is deposited on substrate 212 through a corresponding shadow mask 222 in the presence of a suitable vacuum as substrate 212 is advanced through the deposition vacuum vessels 210 by the action of dispensing reel 214 and take-up reel 216, whereupon plural progressive patterns are formed on substrate 212. More specifically, substrate 212 has plural portions, each of which are positioned for a predetermined interval in each deposition vacuum vessel 210. During this predetermined interval, material is deposited from the corresponding deposition source 218 onto the portion of substrate 212 that is positioned in the corresponding deposition vacuum vessel 210. After this predetermined interval, substrate 212 is step advanced so that the portion of substrate 212 is advanced to the next vacuum vessel in series for additional processing, as applicable. This step advancement continues until each portion of substrate 212 has passed through all deposition vacuum vessels 210. Thereafter, each portion of substrate 212 exiting the final deposition vacuum vessel 210 in the series is received on take-up reel 216, which is positioned in a storage vacuum vessel (not shown). Alternatively, each portion of substrate 212 exiting production system 200 is separated from the remainder of substrate 212 by a cutter (not shown).

Figure 3A:
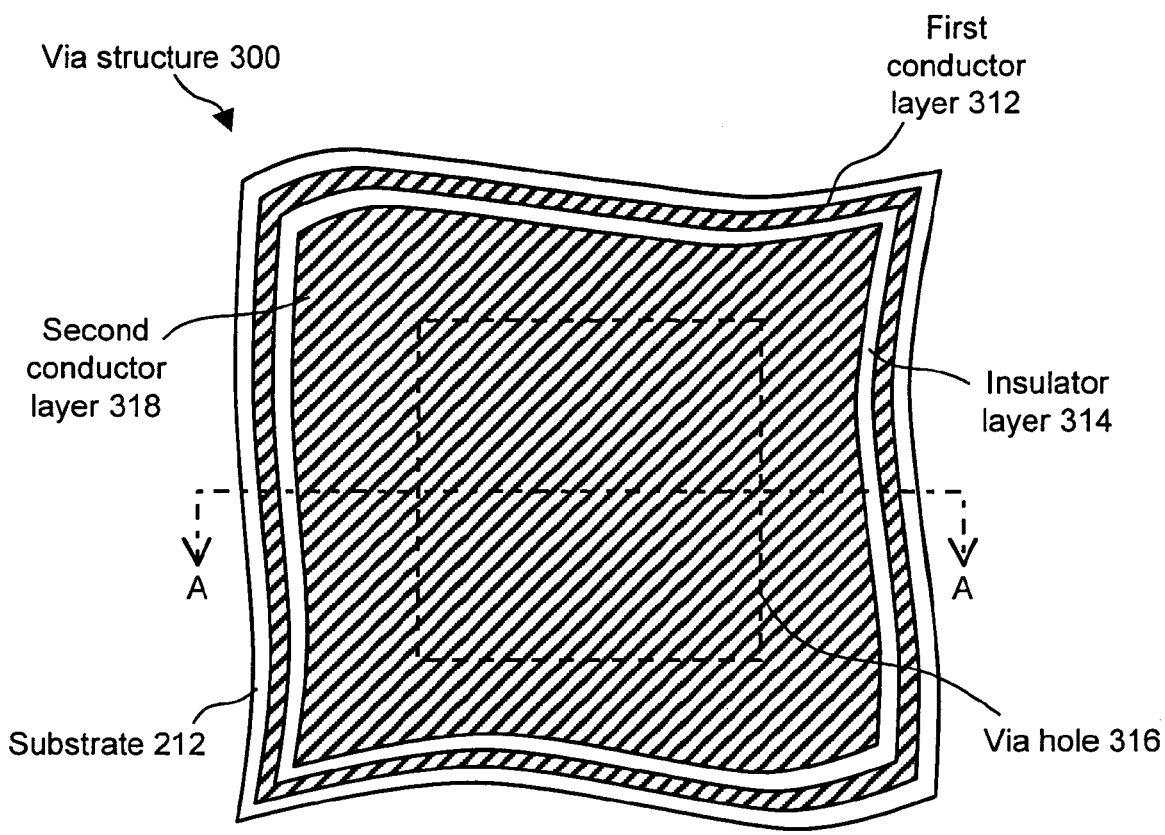
FIG. 3A is a plan view of an exemplary via structure formed in accordance with the present invention by way of the production system of FIG. 2A.
Figure 3B:
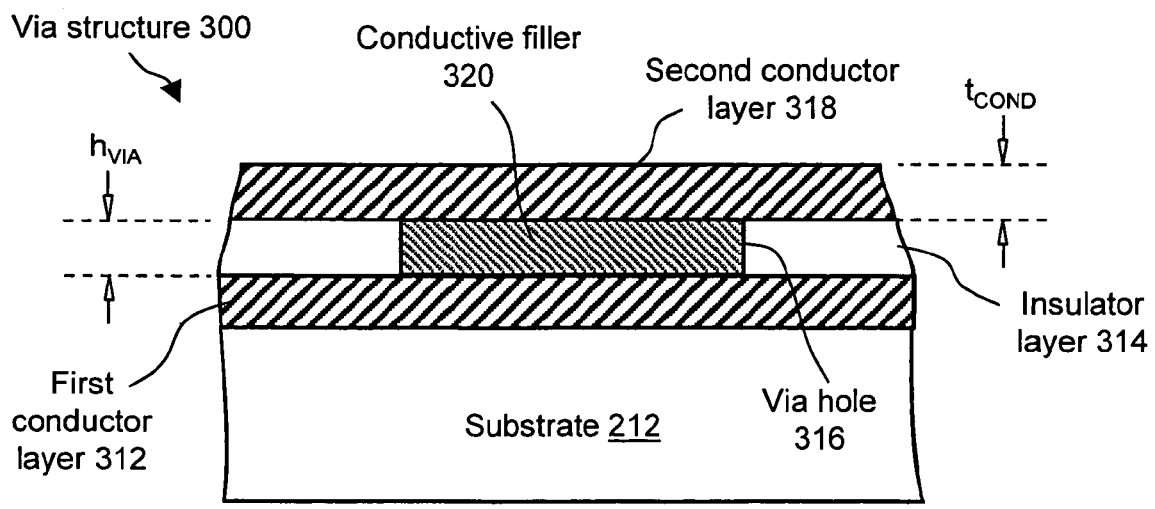
FIG. 3B is a cross section taken along line A-A in FIG. 3A.

With reference to FIGS. 3A and 3B, an exemplary multi-layer via structure 300 formed by use of production system 200 includes substrate 212, atop which is deposited a first conductor layer 312, an insulator layer 314 including a via hole 316 deposited atop first conductor layer 312 and a second conductor layer 318 deposited atop insulator layer 314. Via hole 316 is filled with a conductive filler 320.

First conductor layer 312, second conductor layer 318 and conductive filler 320 are formed of typical metals used to form conductive layers and interconnections in semiconductor fabrication, such as, without limitation, aluminum, gold, copper, nickel, titanium, a metal alloy or a metal compound. Insulator layer 314 is a non-conductive layer that is formed of any common circuit insulator material, such as, without limitation, aluminum oxide ($Al_2O_3$) or tantalum pentoxide ($Ta_2O_5$). Conductive filler 320 serves as a conductive path between first conductor layer 312 and second conductor layer 318. The shape of via hole 316 is not limited to a square since via hole 316 may be any desired shape, such as, without limitation, circular, oval or rectangular.

Via hole 316 is a region within insulator layer 314 where conductive filler 320 is deposited to bridge the gap between first conductor layer 312 and second conductor layer 318 at the region of via hole 316 thereby forming an electrical connection between first conductor layer 312 and second conductor layer 318. Conductive filler 320 is deposited within via hole 316 such that the surface of conductive filler 320 opposite first conductor layer 312 is substantially planar with the surface of insulator layer 314 opposite first conductor layer 312 and the deposition of second conductor layer 318 poses no problem for establishing an electrical connection thereto regardless of the ratio of $h_{VIA}$ to $t_{COND}$. Outside the region defined by via hole 316, first conductor layer 312 and second conductor layer 318 are isolated electrically by non-conductive insulator layer 314. Other conductive or non-conductive layers of material may exist upon substrate 212 but, for simplicity, are not shown in FIGS. 3A and 3B.

The opening defined by via hole 316 within insulator layer 314 can be formed by a plasma etch operation within a plasma etch vacuum vessel 215, shown in phantom in FIG. 2A, of production system 200, wherein a portion of the material of insulator layer 314 is removed. Plasma etch vacuum vessel 215 is easily integrated into production system 200. A plasma etch operation to form a via hole in a continuous inline vacuum deposition process is described in U.S. patent application Ser. No. 11/026,365, entitled "System For And Method Of Forming Via Holes By Use Of Selective Plasma Etching In A Continuous Inline Shadow Mask Deposition Process", filed on Dec. 30, 2004 (hereinafter "the '365 application"), which is incorporated herein by reference.

Briefly, the '365 application discloses the use of a plasma etch vacuum vessel, like plasma etch vacuum vessel 215, having a shadow mask 216 that is aligned and brought into contact with the portion of substrate 212 in plasma etch vacuum vessel 215. Shadow mask 216 includes an aperture that corresponds to the size and shape of each via hole 316 to be formed thereby. Plasma gas 224 from source 226 passes through each aperture of shadow mask 216 and impinges on the surface of insulator layer 314 exposed therethrough, whereupon the surface of insulator layer 314 exposed in said aperture is etched away to form via hole 316. The surface of shadow mask 216 facing away from insulator layer 314 blocks the surface of insulator layer 314 that is outside each aperture from experiencing plasma etching. The duration of the plasma etch operation within plasma etch vacuum vessel 215 is suitable to etch away the full thickness of insulator layer 314. One or more plasma etch vacuum vessels 215 can also be provided for plasma etching one or more conductor layers, such as second conductor layer 318, shown best in FIG. 4B.

Alternatively, the opening defined by via hole 316 within insulator layer 314 can be formed by two or more deposition events within one or more deposition vacuum vessels 210 of production system 200, as described in U.S. patent application Ser. No. 11/020,907, entitled, "System For And Method Of Forming Via Holes By Multiple Deposition Events In A Continuous Inline Shadow Mask Deposition Process", filed Dec. 23, 2004 (hereinafter "the '907 application"), which is incorporated herein by reference.

Briefly, the '907 application discloses depositing an insulator layer in two deposition events such that an edge of the insulator layer deposited in the second deposition event and having one or more notches therein overlaps an edge of the insulator layer deposited in the first deposition event whereupon a portion of each notch remains open thereby defining a corresponding via hole. Similarly, a conductor layer, such as second conductor layer 318 in FIG. 4B, can be deposited in two deposition events such that an edge of the conductor layer deposited in the second deposition event and having one or more notches therein overlaps an edge of the conductor layer deposited in the first deposition event whereupon a portion of each notch remains open thereby defining a corresponding via hole.

Figure 4A:
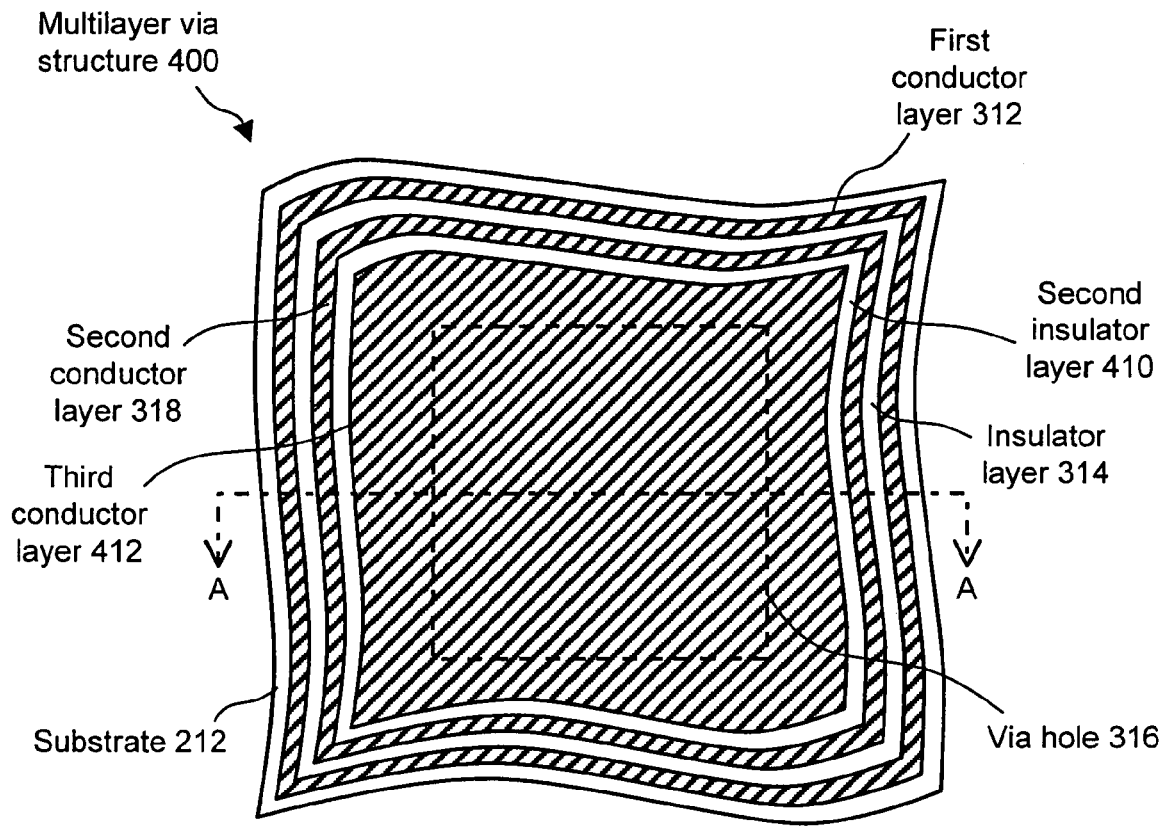
FIG. 4A is a plan view of another exemplary via structure formed in accordance with the present invention by way of the production system of FIG. 2A.
Figure 4B:
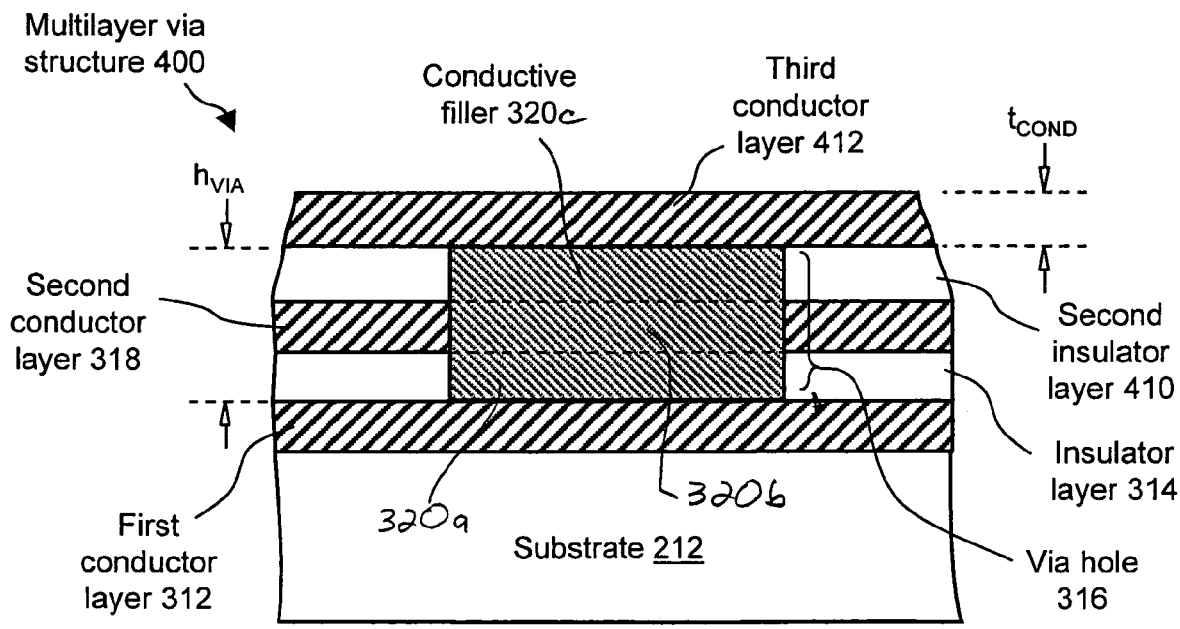
FIG. 4B is a cross section taken along line A-A in FIG. 4A.

With reference to FIGS. 4A and 4B, another exemplary multi-layer via structure 400 includes substrate 212 atop which is deposited a first conductor layer 312, an insulator layer 314 deposited atop first conductor layer 312 and a second conductor layer 318 deposited atop insulator layer 314, as described with reference to FIGS. 3A and 3B. Multi-layer via structure 400 further includes a second insulator layer 410, which is formed of the same non-conductive material as insulator layer 314, deposited atop second conductor layer 318 and a third conductor layer 412 deposited atop second insulator layer 410. Third conductor layer 412 is formed of the same conductive material as first conductor layer 312, second conductor layer 318 and conductive filler 320. Via hole 316 is formed in the multi-layer structure formed by insulator layer 314, second conductor layer 318 and second insulator layer 410 either by plasma etching or by the selective deposition of layers 314, 318 and 410 in a manner to define via hole 316 such that the $h_{VIA}$ of via hole 316 increases with the deposition of each layer 314, 318 and 410. Via hole 316 is filled with conductive filler 320.

With reference to FIG. 4B and with continuing reference to FIG. 4A, via hole 316 spans the multiplayer structure formed by insulator layer 314, second conductor layer 318 and second insulator layer 410. Conductive filler 320 is deposited within via hole 316 to bridge the gap and form an electrical connection between first conductor layer 312, second conductor layer 318 and third conductor layer 412. Conductive filler 320 is deposited within via hole 316 such that the surface of conductive filler 320 opposite first conductor layer 312 is substantially planar with the surface of second insulator layer 410 opposite first conductor layer 312 whereupon the deposition of third conductor layer 412 poses no problem for establishing an electrical connection thereto, regardless of the ratio of $h_{VIA}$ to $t_{COND}$.

Figure 5:
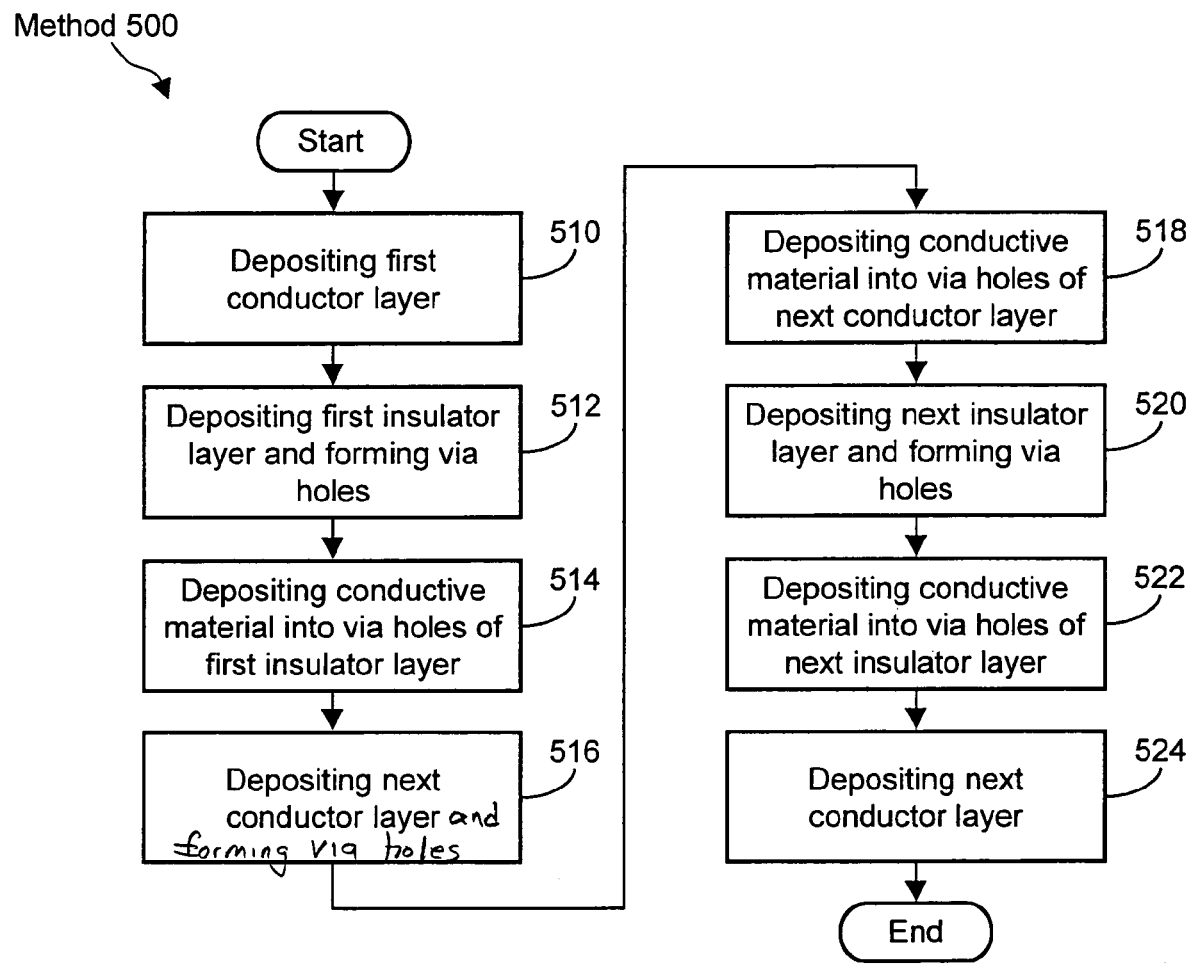
FIG. 5 is a flow diagram of a method of planarizing the contact region of a via by way of the production system of FIG. 2A.

With reference to FIG. 5, a flow diagram of a method 500 of making multi-layer via structure 400 by use of production system 200 includes step 510, wherein substrate 212 is advanced into, for example, a first deposition vacuum vessel 210a of production system 200 by use of the reel-to-reel system formed by dispensing reel 214 and take-up reel 216. Once in deposition vacuum vessel 210a, the associated shadow mask 222a is aligned and brought into intimate contact with substrate 212. A first conductive layer, such as first conductor layer 312, is then deposited on substrate 212 by the action of the associated deposition source 218a through the aperture pattern of shadow mask 222a, which has an aperture pattern that matches the layout of first conductor layer 312.

The method then advances to step 512, wherein substrate 212 is advanced into the next deposition vacuum vessel 210b of production system 200 by use of the reel-to-reel system. The shadow mask 222b of deposition vacuum vessel 210b is then aligned and brought into intimate contact with first conductor layer 312. An insulator layer, such as insulator layer 314, is then deposited on first conductor layer 312 by the action of the associated deposition source 218b through the aperture pattern of shadow mask 222b, which has an aperture pattern that matches the layout of insulator layer 314. One or more via holes 316 are formed in insulator layer 314 either by plasma etching in a plasma etch vacuum vessel, such as plasma etch vacuum vessel 215, or by two or more selective depositions of insulator layer 314 by way of one or more shadow masks 222 in a manner to define the via hole(s) 316 in insulator layer 314 by deposition events only.

The method then advances to step 514, wherein substrate 212 is advanced into the next deposition vacuum vessel 210c of production system 200 by use of the reel-to-reel system. The shadow mask 222c of deposition vacuum vessel 210c is then aligned and brought into intimate contact with insulator layer 314. A conductive material, such as conductive filler 320a, is then deposited on the first conductor layer 312 exposed in each via hole 316 of insulator layer 314 by the action of the associated deposition source 218c through the aperture pattern of shadow mask 222c, which has an aperture pattern that matches the layout of via holes 316. Conductive filler 320 is deposited within each via hole 316 of insulator layer 314, such that the surface of conductive filler 320 opposite first conductor layer 312 is substantially planar with the surface of insulator layer 314 opposite first conductor layer 312.

The method then advances to step 516, wherein substrate 212 is advanced into the next deposition vacuum vessel 210d of production system 200 by use of the reel-to-reel system. The shadow mask 222d of deposition vacuum vessel 210d is then aligned and brought into intimate contact with insulator layer 314. A next conductive layer, such as second conductor layer 318, is then deposited on insulator layer 314 by the action of the associated deposition source 218d through the aperture pattern of shadow mask 222d, which has an aperture pattern that matches the layout of second conductor layer 318. One or more via holes 316 are formed in second conductor layer 318 either by plasma etching in a plasma etch vacuum vessel, such as plasma etch vacuum vessel 215, or by two or more selective depositions of second conductor layer 318 by way of one or more shadow masks 222 in a manner to define the via hole(s) 316 in second conductor layer 318 by deposition events only.

The method then advances to step 518, wherein substrate 212 is advanced into the next deposition vacuum vessel 210e of production system 200 by use of the reel-to-reel system. The shadow mask 222e of deposition vacuum vessel 210e is aligned and brought into intimate contact with second conductor layer 318. A conductive material, such as conductive filler 320b, is then deposited on conductive filler 320a exposed in each via hole 316 of second conductor layer 318 by the action of the associated deposition source 218e through the aperture pattern of shadow mask 222e, which has an aperture pattern that matches the layout of via holes 316. Conductive filler 320b is deposited within each via hole 316 of second conductor layer 318 such that the surface of conductive filler 320b opposite conductive filler 320a is substantially planar with the surface of second conductor layer 318.

The method then advances to step 520, wherein substrate 212 is advanced into the next deposition vacuum vessel 210f of production system 200 by use of the reel-to-reel system. The shadow mask 222f of deposition vacuum vessel 210f is then aligned and brought into intimate contact with second conductor layer 318. A next insulator layer, such as second insulator layer 410, is then deposited on second conductor layer 318 by the action of the associated deposition source 218f through the aperture pattern of shadow mask 222f, which has an aperture pattern that matches the layout of second insulator layer 410. One or more via holes 316 are formed in second insulator layer 410 either by plasma etching in a plasma etch vacuum vessel, such as plasma etch vacuum vessel 215, or by two more selective depositions of second insulator layer 410 by way of one or more shadow masks 222 in a manner to define the via holes 316 in second insulator layer 410 by deposition events only.

The method then advances to step 522, wherein substrate 212 is advanced into the next deposition vacuum vessel 210g of production system 200 by use of the reel-to-reel system. The shadow mask 222g of deposition vacuum vessel 210a is then aligned and brought into intimate contact with second insulator layer 410. A conductive material, such as conductive filler 320c, is then deposited on the conductive filler 320b exposed in each via hole 316 of second insulator layer 410 by the action of the associated deposition source 218g through the aperture pattern of shadow mask 222g, which has an aperture pattern that matches the layout of via holes 316. Conductive filler 320c is deposited within each via hole 316 of second insulator layer 410, such that the surface of conductive filler 320c opposite conductive filler 320b is substantially planar with the surface of second insulator layer 410.

The method then advances to step 524, wherein substrate 212 is advanced into the next deposition vacuum vessel 210h of production system 200 by use of the reel-to-reel system. The shadow mask 222h of deposition vacuum vessel 210h is then aligned and brought into intimate contact with second insulator layer 410. A conductive layer, such as third conductor layer 412, is then deposited on second insulator layer 410 and on one or more instances of conductive filler 320c by the action of the associated deposition source 218h through the aperture pattern of shadow mask 222h, which has an aperture pattern that matches the layout of third conductor layer 412. As a result, an electrical connection is formed between first conductor layer 312, second conductor layer 318 and third conductor layer 412 by way of the stack-up of conductive fillers 320a, 320b and 320c that have been deposited spanning the full $h_{VIA}$ thickness of each via hole 316 of multi-layer via structure 400.

Alternatively, instead of conductive fillers 320a, 320b and 320c being deposited in multiple deposition events in steps 514, 518 and 522, steps 514 and 518 can be eliminated and a single deposition of conductive filler 320 can occur at step 522 in order to fill the full $h_{VIA}$ thickness of via hole 316.

As can be seen, production system 200 and method 500 provide a way of planarizing the contact region of a via by use of a continuous inline vacuum deposition process for forming multi-layer electrical devices. Production system 200 includes any user-desired configuration of one or more deposition vacuum vessels 210, within each of which a deposition event can occur by use of one or more shadow masks 222. If necessary, production system 200 can also include one or more plasma etch vacuum vessels 215.

Production system 200 and method 500 provide a way of filling one or more via holes 316 of an insulator and/or conductor layer such that the surface of the conductive material that fills each via hole 316, e.g., conductive filler 320, is substantially planar with the surface of the associated layer, such as insulator layer 314, second conductor layer 318 or second insulator layer 410, whereupon the deposition of a conductor atop via hole 316 can readily establish an electrical connection to conductive filler 320, regardless of the ratio of $h_{VIA}$ to $t_{COND}$ thereby facilitating electrical continuity between each pair of conductor layers separated by an insulator layer.

Furthermore, the use of production system 200 and method 500 for planarizing the contact region of a via avoids the interruption of the process flow to form via holes using other processes, such as a photolithography process, which are not integrated easily into a continuous inline vacuum deposition process.

The present invention has been described with reference to the preferred embodiment. Obvious modifications and alterations will occur to others upon reading and understanding the preceding detailed description. It is intended that the invention be construed as including all such modifications and alterations insofar as they come within the scope of the appended claims or the equivalents thereof.

The invention to be claimed is:

1. A method of forming a multi-layer electronic device comprising:
   (a) vapor depositing a first conductor layer (312) on an insulative substrate (212) by way of a first shadow mask;
   (b) vapor depositing a first insulator layer (314) on the first conductor layer (312) by way of a second shadow mask, the first insulator layer (314) having at least one via hole (316) therein;
   (c) vapor depositing a first conductive filler (320*a*) in the via hole (316) of the first insulator layer (314) by way of a third shadow mask such that the first conductive filler (320*a*) fills the via hole 316; and
   (d) vapor depositing a second conductor layer (318) on the first insulator layer (314) by way of a fourth shadow mask.

2. The method of claim 1, wherein the second conductor layer (318) is either deposited on the first conductive filler (320*a*) in the via hole (316) of the first insulator layer (314) or has at least one via hole (316) therein in alignment with the via hole (316) in the first insulator layer (314).

3. The method of claim 2, further including:
   (e) vapor depositing a second conductive filler (320*b*) in the via hole (316) of the second conductor layer (318) by way of a fifth shadow mask;
   (f) vapor depositing a second insulator layer (410) on the second conductor layer (318) by way of a sixth shadow mask, the second insulator layer (410) having at least one via hole (316) therein in alignment with the via hole (316) of the second conductor layer (318);
   (g) vapor depositing a third conductive filler (320*c*) in the via hole (316) of the second insulator layer (410) by way of a seventh shadow mask; and
   (h) vapor depositing a third conductor layer (412) on the second insulator layer (410) and the third conductive filler (320*c*) in the via hole (316) of the second conductor layer (318) by way of an eighth shadow mask.

4. The method of claim 2, wherein each via hole is formed by one of plasma etching and selective depositions of the material in which the via hole resides such that the via hole is formed only by said selective depositions.

5. The method of claim 1, wherein the first conductive filler (320*a*) is deposited in the via hole (316) of the first insulator layer (314) such that the surface of the first conductive filler (320*a*) opposite the first insulator layer (314) is substantially planar with the surface of the first insulator layer (314) opposite the first conductor layer (312).

6. The method of claim 3, wherein each conductive filler (320*a*, 320*b*, 320*c*) is deposited such that the surface thereof opposite the layer underlying said conductive filler is substantially planar with the surface of the layer in which the via hole receiving said conductive filler resides.

7. A method of forming a multi-layer electronic device comprising:
   (a) vapor depositing a first conductor layer (312) on an insulative substrate (212) by way of a first shadow mask;
   (b) vapor depositing a first insulator layer (314) on the first conductor layer (312) by way of a second shadow mask, the first insulator layer (314) having at least one via hole (316) therein; and
   (c) vapor depositing a conductive filler (320) in the via hole (316) of the first insulator layer (314) by way of a third shadow mask such that the conductive filler (320) fills the via hole (316).

8. The method of claim 7, wherein the conductive filler (320) is deposited in the via hole (316) of the first insulator layer (314) such that the surface of the conductive filler (320) opposite the first conductor layer (312) is substantially planar with the surface of the first insulator layer (314) opposite the first conductor layer (312).

9. The method of claim 7, further including vapor depositing a second conductor layer (318) on the first insulator layer (314) by way of a fourth shadow mask.

10. The method of claim 9, wherein the second conductor layer (318) either is deposited on the conductive filler (320) in the via hole (316) of the first insulator layer (314) or has at least one via hole (316) therein in alignment with the via hole (316) in the first insulator layer.

11. The method of claim 10, wherein step (c) includes simultaneously vapor depositing the conductive filler (320) in the via holes of the first insulator layer (314) and the second conductor layer (318).

12. The method of claim 10, further including vapor depositing a second insulator layer (410) on the second conductor layer (318) by way of a fifth shadow mask, the second insulator layer (410) having at least one via hole (316) therein in alignment with the via hole (316) of the second conductor layer (318), wherein step (c) includes simultaneously vapor depositing the conductive filler (320) in the via holes of the first insulator layer (314), the second conductor layer (318) and the second insulator layer (410).

13. The method of claim 12, further including vapor depositing a third conductor layer (412) on the second insulator layer (410) and on the conductive filler (320) in the via hole of the second insulator layer (410).

* * * * *